United States Patent
Sun et al.

[11] Patent Number: 6,150,209
[45] Date of Patent: Nov. 21, 2000

[54] LEAKAGE CURRENT REDUCTION OF A TANTALUM OXIDE LAYER VIA A NITROUS OXIDE HIGH DENSITY ANNEALING PROCEDURE

[75] Inventors: Shi-Chung Sun, Los Altos, Calif.; Jiann-Shing Lee, Ben-Chiao, Taiwan

[73] Assignee: Taiwan Semiconductor Manufacturing Company, Hsin-Chu, Taiwan

[21] Appl. No.: 09/298,451

[22] Filed: Apr. 23, 1999

[51] Int. Cl.[7] .................................................. H01L 21/8242
[52] U.S. Cl. ............................................. 438/240; 438/253
[58] Field of Search ....................... 438/3, 240, 253–256, 438/381, 396–399, 238

[56] References Cited

U.S. PATENT DOCUMENTS

| | | | |
|---|---|---|---|
| 5,352,623 | 10/1994 | Kamiyama | 437/52 |
| 5,468,687 | 11/1995 | Carl et al. | 437/235 |
| 5,622,888 | 4/1997 | Sekine et al. | 438/398 |
| 5,641,702 | 6/1997 | Imai et al. | 438/396 |
| 5,786,248 | 7/1998 | Schuegraf | 428/240 |
| 5,804,852 | 9/1998 | Yang et al. | 257/308 |

*Primary Examiner*—Jey Tsai
*Attorney, Agent, or Firm*—George O. Saile; Stephen B. Ackerman

[57] ABSTRACT

A process of fabricating a capacitor structure, using a tantalum oxide capacitor dielectric layer, has been developed. The process features deposition of a thin, high dielectric constant tantalum oxide layer, followed by a high density plasma anneal procedure, used to reduce the leakage current in the as-deposited tantalum oxide layer, that can evolve during normal operating conditions of the capacitor structure. The high density plasma anneal procedure is performed in a nitrous oxide ambient, at a temperature of about 400° C.

16 Claims, 3 Drawing Sheets

LEAKAGE CURRENT REDUCTION OF A TANTALUM OXIDE LAYER VIA A NITROUS OXIDE HIGH DENSITY ANNEALING PROCEDURE

BACKGROUND OF THE INVENTION (1) Field of the Invention

The present invention relates to processes used to fabricate semiconductor devices, and more specifically to a process used to reduce the leakage current of a capacitor dielectric layer.

(2) Description of Prior Art

The trend to micro-miniaturization, or the use of sub-micron features, have allowed the semiconductor industry to reduce the size of semiconductor chips, resulting in a greater number of semiconductor chips, obtained from a specific size, starting substrate, thus reducing the processing cost of sub-micron, semiconductor chips. However the advent of smaller semiconductor chips, with smaller areas now allowed for specific semiconductor elements, have made the use of novel designs and configurations for dynamic random access memory, (DRAM), capacitor structures, imperative. Since there is less horizontal space allotted for the DRAM, stacked capacitor, (STC), structure, usually overlying a narrow width gate structure, the storage node structures, of stacked capacitor designs, have to be fabricated using novel configurations, comprised with multiple vertical features, extending upward from a horizontal feature of the storage node structure, to realize the desired surface area, previously achieved with larger capacitor structures. This type of configuration, as disclosed by Yang et al, in U.S. Pat. No. 5,804,852, overcomes the reduced storage node surface area, via use of a storage node structure, comprised with the multiple vertical features. The increased surface area, offered by the multiple vertical features, results in the desired capacitance, and DRAM performance, however the additional processing, and complexity, used to fabricate a storage node structure, comprised with multiple vertical features, compromises the cost benefits derived via the use of smaller semiconductor chips.

This invention will describe a DRAM fabrication process in which a high dielectric constant, capacitor dielectric layer, is used to obtain the desired, increased capacitance. The use of the high dielectric constant, capacitor dielectric layer, will offer the desired, DRAM capacitance, without employing the difficult and costly processes, needed to fabricate the multiple featured, storage node structures. Tantalum oxide, ($Ta_2O_5$), with a dielectric constant between about 15 to 30, can be used to increase the capacitance of DRAM structures, when compared to DRAM structures fabricated with silicon oxide, capacitor dielectric layers, offering a dielectric constant of only about 3.9. However to successfully use this high dielectric constant layer, leakage currents, inherent in $Ta_2O_5$ layers, obtained via low temperature deposition procedures, have to be reduced. This invention will teach a procedure in which a nitrous oxide anneal cycle, performed in a high density plasma, results in reductions of leakage current, evolving at normal, capacitor operating voltages. Prior art, such as Kamiyama, in U.S. Pat. No. 5,352,623, describes a method of annealing a $Ta_2O_5$ layer at a temperature between about 600 to 1000° C., in nitrous oxide, while Carl et al, describe an ozone anneal treatment for the $Ta_2O_5$ layer, at a temperature of about 400° C. However none of those prior arts describe the unique low temperature anneal conditions, using an nitrous oxide ambient, in a high density plasma, needed to reduce leakage currents.

SUMMARY OF THE INVENTION

It is an object of this invention to fabricate a capacitor structure, using a $Ta_2O_5$ layer, for the capacitor dielectric layer.

It is another object of this invention to reduce the leakage current, inherent in low temperature, as deposited, $Ta_2O_5$ layers, via a high density plasma, (HDP), anneal procedure.

It is still another object of this invention to perform the HDP anneal procedure, at a temperature of about 400° C., in a nitrous oxide ambient.

In accordance with the present invention a method of creating a $Ta_2O_5$ layer, for use as a DRAM capacitor dielectric layer, featuring a post-deposition, HDP procedure, performed in a $N_2O$ ambient, to reduce the leakage current of the $Ta_2O_5$ layer, has been developed. After formation of a transfer gate transistor, a storage node contact hole is formed in an insulator layer, exposing a portion of the top surface of the transfer gate transistors, source/drain region. After forming a conductive plug in the storage node contact hole, an overlying storage node structure is formed, overlying and contacting the conductive plug structure. A chemically vapor deposited, thin $Ta_2O_5$ layer is deposited, overlying the storage node structure, followed by a low temperature, high density plasma anneal procedure, performed in a $N_2O$ ambient, improving the integrity of the $Ta_2O_5$ layer, in terms of leakage current reduction. An upper plate, or electrode, is next formed, overlying the $Ta_2O_5$ capacitor dielectric layer, completing the formation of the DRAM capacitor structure, featuring the use of the high dielectric constant, $T_2O_5$, dielectric layer.

BRIEF DESCRIPTION OF THE DRAWINGS

The object and other advantages of this invention are best described in the preferred embodiments, with reference to the attached drawings that include.

DESCRIPTION OF THE PREFERRED EMBODIMENTS

The method of fabricating a tantalum oxide layer, for use as a capacitor dielectric layer, featuring a post-deposition, high density plasma anneal procedure, performed in a nitrous oxide ambient, used to reduce the leakage current of the tantalum oxide layer, will now be described in detail. This invention will be described using the tantalum oxide layer, as the capacitor dielectric layer, for a DRAM, stacked capacitor structure, however the tantalum oxide, capacitor layer, can also be used as an element for non-DRAM capacitor structures, such as capacitor structures used for logic devices. This invention also will describe the tantalum oxide layer, used overlying a flat, smooth, polysilicon storage node structure. However the tantalum oxide layer, described in this invention, can also be applied to a polysilicon storage node structure, comprised with multiple vertical features, or applied to a storage node structure comprised with roughened, or a hemispherical grained silicon surface. In addition, although the capacitor structure in this description is shown comprised with a polysilicon storage node, and a polysilicon upper plate electrode, the tantalum oxide dielectric layer, can be used for capacitor structures in which the storage node, and upper electrode, can be comprised of metal, such as aluminum, or such as titanium nitride.

Figure 1:
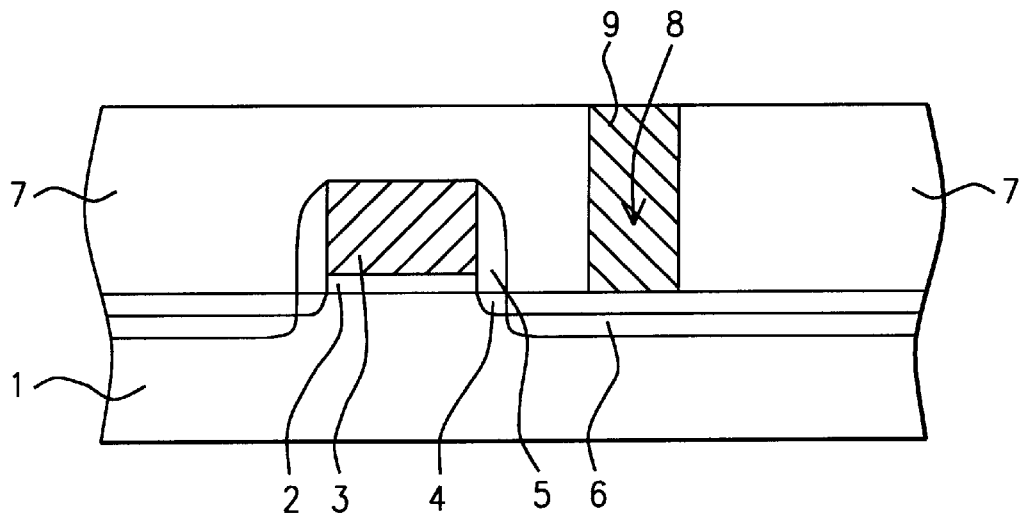
FIGS. 1–5, which schematically, in cross-sectional style, show the key stages of fabrication used to fabricate a DRAM capacitor structure, featuring a $Ta_2O_5$ capacitor dielectric layer, that is subjected to a post-deposition, high density plasma anneal procedure, to improve the integrity of the $Ta_2O_5$ layer.

FIG. 1, schematically shows the metal oxide semiconductor field effect transistor, (MOSFET), structure, to which the DRAM structure, and the tantalum oxide capacitor layer, will be applied to. A P type, semiconductor substrate 1, comprised of single crystalline silicon, with a <100> crystallographic orientation, is used. A gate insulator layer 2, comprised of silicon dioxide, is thermally grown in an oxygen—steam ambient, to a thickness between about 17 to 50 Angstroms. A polysilicon layer is deposited, via low pressure chemical vapor deposition, (LPCVD), procedures, to a thickness between about 1000 to 3000 Angstroms, and either doped in situ, during deposition, via the addition of arsine or phosphine, to a silane ambient, or deposited intrinsically, than doped via ion implantation of arsenic or phosphorous ions. Conventional photolithographic and reactive ion etching, (RIE), procedures, are use to define polysilicon gate structure 3, from the polysilicon layer. After removal of the photoresist shape, used for definition of polysilicon gate structure 3, via plasma oxygen ashing and careful wet cleans, lightly doped source/drain region 4, is formed via ion implantation of arsenic or phosphorous ions. Insulator spacers 5, comprised of silicon oxide, or silicon nitride, are formed on the sides of polysilicon gate structure 3, via deposition of silicon oxide, or silicon nitride, via LPCVD or plasma enhanced chemical vapor deposition, (PECVD), procedures, at a thickness between about 500 to 3000 Angstroms, followed by an anisotropic RIE procedure, using $CHF_3$ as an etchant. Heavily doped source/drain region 6, is then formed in regions of semiconductor substrate 1, not covered by polysilicon gate structure 3, or by insulator spacers 5, via another ion implantation procedure, performed at an energy between about 10 to 60 KeV, at a dose between about 2E15 to 1E16 atoms/$cm^2$. The results of these procedures is schematically shown in FIG. 1.

Insulator layer 7, comprised of silicon oxide, or of borophosphosilicate glass, (BPSG), is next deposited, via LPCVD, or PECVD, procedures, at a thickness between about 5000 to 10000 Angstroms, followed by a chemical mechanical polishing, (CMP), procedure, used to create a smooth top surface topography, for insulator layer 7. Conventional photolithographic and anisotropic RIE procedures, using $CHF_3$ as an etchant, are employed to create storage node contact hole 8, in insulator layer 7, exposing a portion of the top surface of heavily doped source/drain region 6. After removal of the photoresist shape, used as a mask for the definition of storage node contact hole 8, via plasma oxygen ashing and careful wet cleans, conductive plug 9, is formed in storage node contact hole 8. Conductive plug structure 9, schematically shown in FIG. 1, can be comprised of polysilicon, obtained via LPCVD procedures of a polysilicon layer, completely filling storage node contact hole 8. The polysilicon layer can be doped in situ, during deposition, via the addition of arsine, or phosphine, to a silane ambient, or the polysilicon layer can be deposited intrinsically, then doped via ion implantation of arsenic, or phosphorous ions. Unwanted regions of the polysilicon layer, residing on the top surface of insulator layer 7, are then removed via a CMP procedure, resulting in the formation of the conductive plug structure. Conductive plug structure 9, can also be comprised of other conductive materials, such as tungsten, or tungsten silicide.

Figure 2:
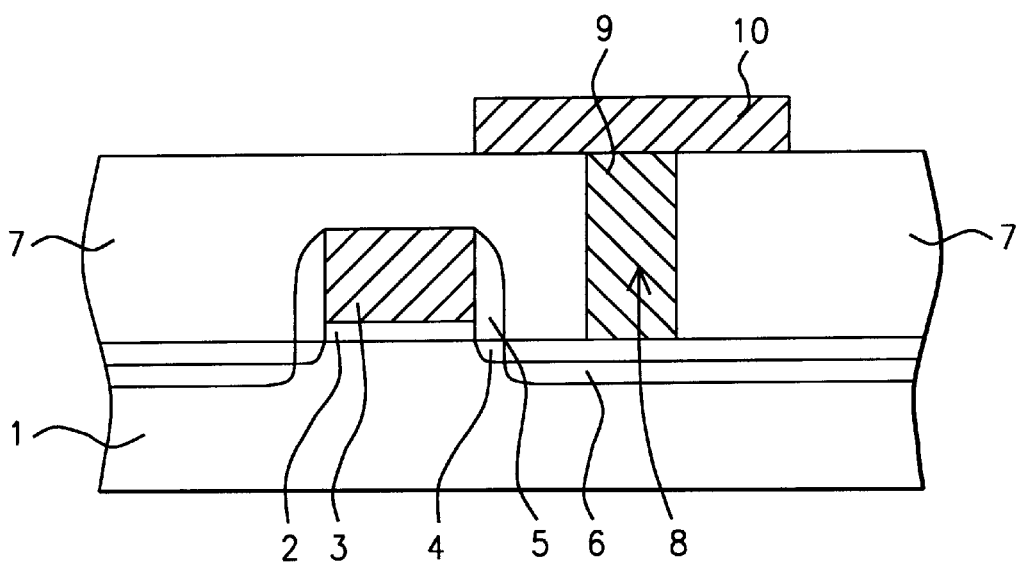

FIG. 2, schematically shows the formation of storage node structure 10, overlying and contacting, conductive plug structure 9. In this description, storage node structure 10, will be comprised of a flat polysilicon shape, but as previously mentioned, this invention can incorporate: a polysilicon storage node structure, comprised with multiple vertical polysilicon, as well as horizontal polysilicon features; a polysilicon storage node structure, comprised with a roughened polysilicon surface, or an HSG silicon surface; or a metal storage node structure, comprised of a metal such as tungsten, tantalum, or tungsten silicide. For this description a polysilicon layer is deposited via LPCVD procedures, to a thickness between about 1000 to 5000 Angstroms. The polysilicon layer can be doped in situ, during deposition, via the addition of arsine, or phosphine, to a silane ambient, or the polysilicon layer can be deposited intrinsically, then subjected to an ion implantation procedure, using arsenic, or phosphorous ions. Conventional photolithographic and RIE procedures, using $Cl_2$ as an etchant, are used to pattern the polysilicon layer, creating storage node structure 10, schematically shown in FIG. 2.

Figure 3:
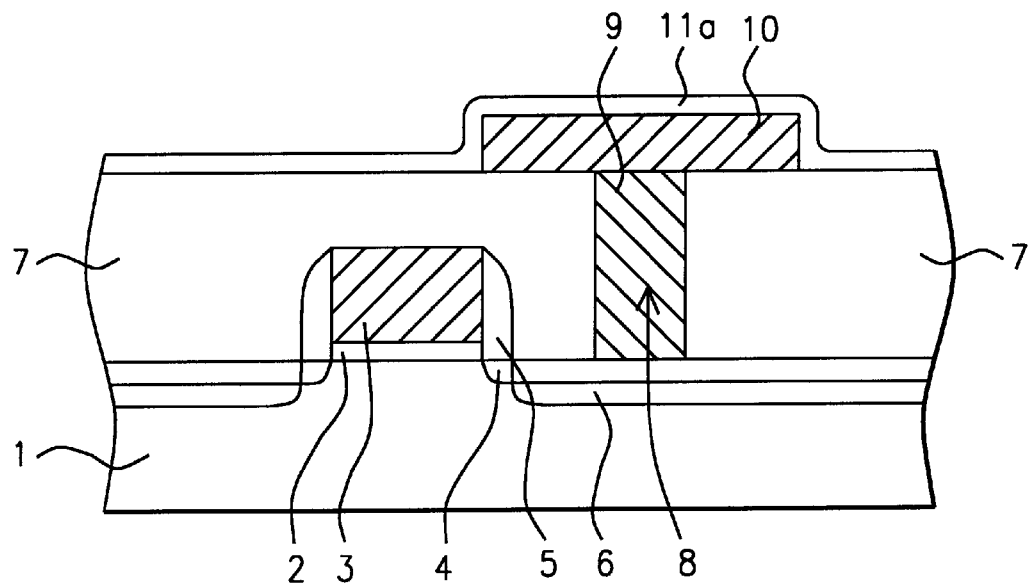

A tantalum oxide, ($Ta_2O_5$), layer, 11a, is next deposited, at a thickness between about 80 to 110 Angstroms, using a chemical vapor deposition, (CVD), procedure, at a temperature between about 400 to 450° C. The tantalum oxide layer can also be deposited using plasma vapor deposition, or R.F. sputtering. The tantalum oxide layer, schematically shown in FIG. 3, has a dielectric constant between about 15 to 30, thus offering increased capacitance, when used as a capacitor dielectric layer, compared to other capacitor dielectric layers, such as $SiO_2$, with a dielectric constant of only about 3.9. However when normal operating voltages are applied to the DRAM capacitor structure, unwanted leakage current, attributed to the as-deposited, tantalum oxide layer 11a, is observed. The undesired leakage current has a deleterious effect on the performance, as well as the reliability, of the DRAM structure.

Figure 4:
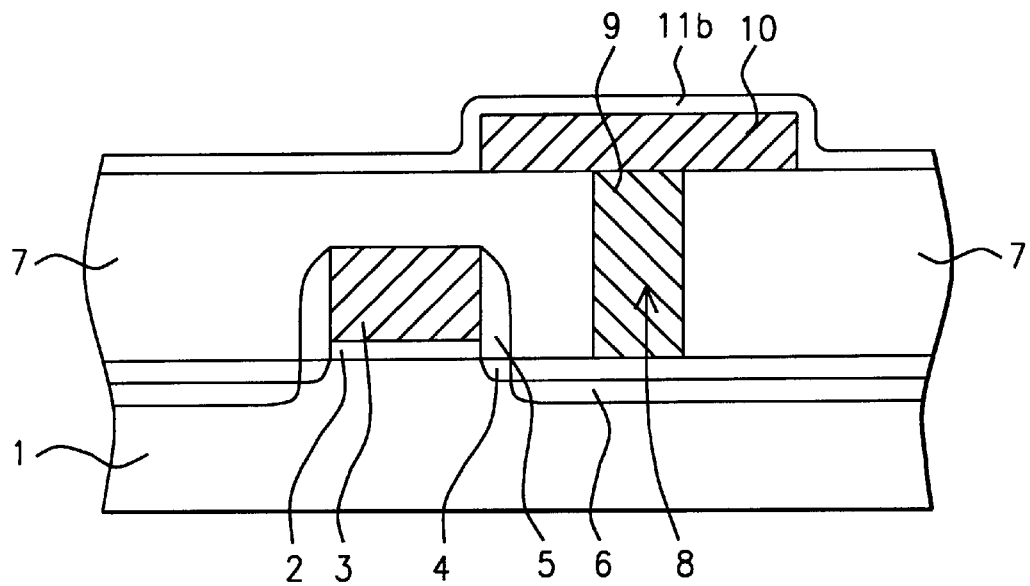

A process employed to reduce the leakage current of a tantalum oxide, capacitor dielectric layer, will now be described. After deposition of tantalum oxide layer 11a, a high density plasma, (HDP), anneal procedure, is performed. The HDP procedure is performed at a temperature between about 400 to 450° C., in a nitrous oxide, ($N_2O$), ambient, at a power between about 2000 to 4000 watts, at a pressure between about 5 to 10 torr, for a time between about 1 to 3 min., using a nitrous oxide flow between about 0.1 to 0.2 milliliters/min. The HDP procedure, performed at a temperature low enough not to exceed the thermal budget of the DRAM fabrication process, results in tantalum oxide layer 11b, schematically shown in FIG. 4, exhibiting reduced leakage current, when compared to the unannealed, as-deposited, tantalum oxide layer 11a. Another advantage of the low temperature annealing procedure is that it is suitable for metal storage node structures. It should also be noted that the low temperature annealing procedure, can also be performed in an oxygen containing ambient, other than nitrous oxide, such as a pure oxygen ambient.

Figure 5:
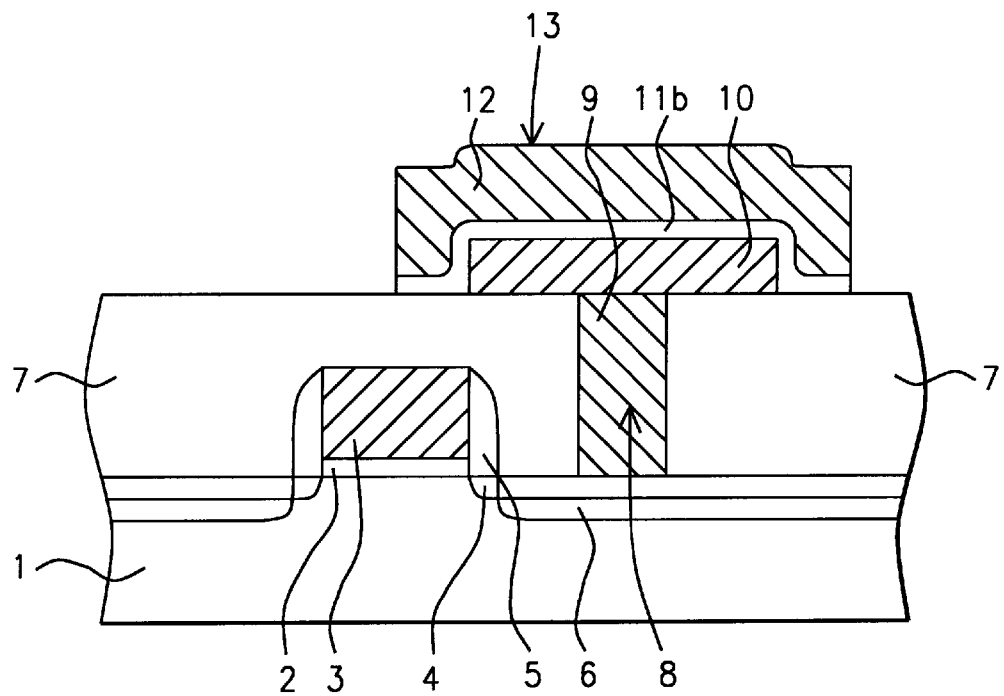

The completion of the DRAM capacitor structure is schematically shown in FIG. 5. A polysilicon layer is deposited, via LPCVD procedures, at a thickness between about 1000 to 5000 Angstroms. As was the case for the polysilicon layer, used for the storage node structure, this polysilicon layer can either be deposited using in situ doping, via the addition of arsine, or phosphine, to a silane ambient, or the polysilicon layer can be deposited intrinsically then subjected to an ion implantation procedure, using arsenic, or phosphorous ions. Conventional photolithographic and RIE procedures, using $Cl_2$ as an etchant for polysilicon, and $CF_4$ or $SF_6$ as an etchant for tantalum oxide layer 11b, are used to create polysilicon upper electrode, or cell plate structure 12. As previously mentioned other conductive materials, such as aluminum, or tungsten, can be used for upper electrode structure 12. Removal of the photoresist shape, used for definition of upper electrode structure 12, is again accomplished using plasma oxygen ashing and careful wet cleans. The resulting DRAM capacitor structure 13, is now comprised using a high dielectric constant, tantalum oxide layer, as a capacitor dielectric layer, with the tantalum oxide layer offering low leakage current, as a result of the post-deposition, HDP anneal procedure, in a nitrous oxide ambient.

Figure 6:
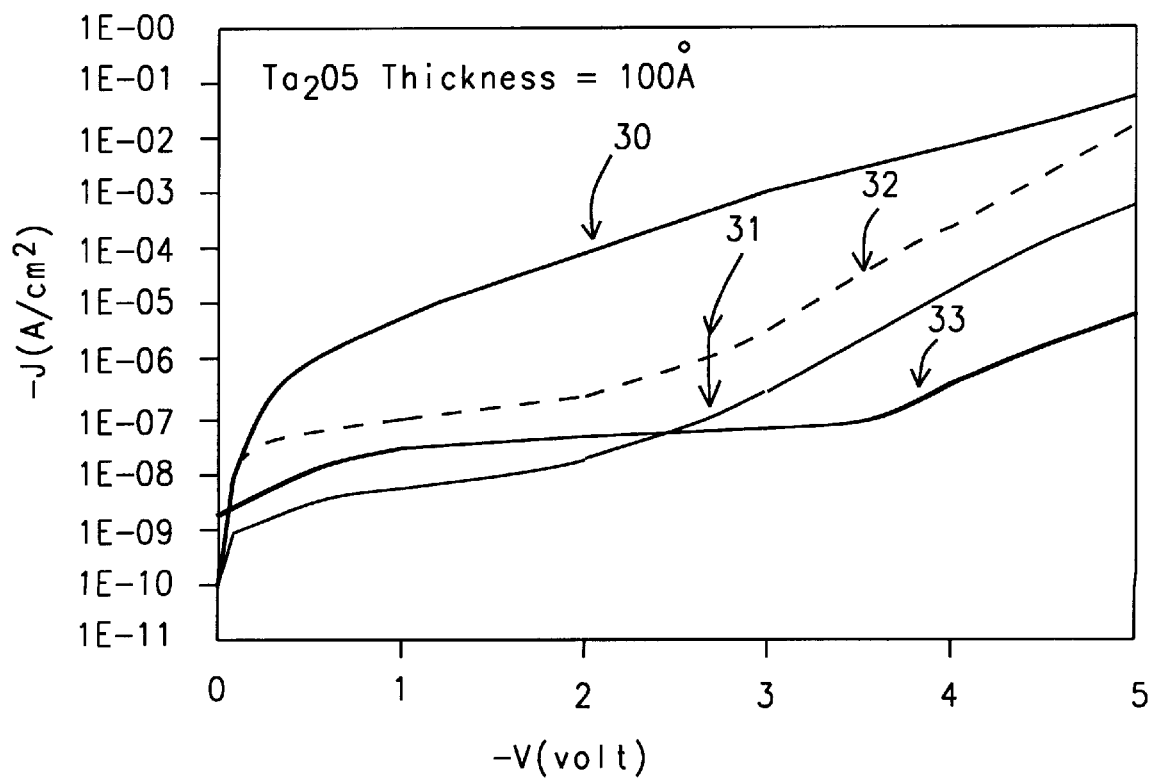
FIG. 6, which graphically shows the leakage reductions, in the $Ta_2O_5$ layer, achieved using this invention

FIG. 6, shows the result of the low temperature, anneal procedure, described in this invention, compared to non-annealed counterparts, or compared to samples annealed at higher temperatures. It can be seen that at applied voltages (V), the leakage current, (−J), is about 4 orders of magnitude greater for as-deposited, or unannealed $Ta_2O_5$ samples 30, when compared to $Ta_2O_5$ samples 31, annealed in nitrous oxide, at a temperature of about 400° C. The same decrease in leakage is observed for $Ta_2O_5$ samples 33, however these samples, (prior art), were annealed at a temperature of about 800° C., which is greater than the thermal budget needed for advanced DRAM devices, allows. $Ta_2O_5$ samples 32, shown in FIG. 6, were annealed at low temperatures, using HDP procedures, in an oxygen ambient, resulting in leakages about one order of magnitude greater than $Ta_2O_5$ samples 31, annealed via the low temperature, HDP procedure, in nitrous oxide.

While this invention has been particularly shown and described with reference to the preferred embodiments thereof, it will be understood by those skilled in the art that various changes in form and detail may be made without departing from the spirit or scope of this invention.

What is claimed is:

1. A method of fabricating a capacitor structure, on a semiconductor substrate, comprising the steps of:

providing a planarized conductive plug structure, in a storage node contact hole, located in an insulator layer, with the conductive plug structure contacting a source/drain region of a transfer gate transistor;

forming a storage node structure, overlying the top surface of said insulator layer, and overlying and contacting, the top surface of said conductive plug structure;

forming a tantalum oxide capacitor dielectric layer directly on said storage node structure;

performing a plasma anneal procedure, in an oxygen containing ambient, at a temperature between about 400 to 450° C.; and forming an upper electrode structure.

2. The method of claim 1, wherein said conductive plug structure is formed from a doped polysilicon layer.

3. The method of claim 1, wherein said storage node structure is a flat polysilicon shape, obtained via deposition of a polysilicon layer, via an LPCVD procedure, at a thickness between about 1000 to 5000 Angstroms, with the polysilicon layer either doped in situ, during deposition, via the addition of arsine, or phosphine, to a silane ambient, or deposited intrinsically, then doped via ion implantation of arsenic, or phosphorous ions, followed by an anisotropic RIE patterning procedure, using $Cl_2$ as an etchant for the polysilicon layer.

4. The method of claim 1, wherein said storage node structure is a polysilicon shape, comprised with vertical polysilicon features, and horizontal polysilicon features.

5. The method of claim 1, wherein said storage node structure is a polysilicon shape, comprised with a roughened polysilicon surface, or comprised with a hemispherical grained silicon surface.

6. The method of claim 1, wherein said storage node structure is a metal shape, comprised of a metal such as tantalum, tungsten, or tungsten silicide.

7. The method of claim 1, wherein said capacitor dielectric layer is a tantalum oxide layer, with a dielectric constant between about 15 to 30, obtained using a chemical vapor deposition procedure, at a thickness about 80 to 110 Angstroms, at a temperature between about 400 to 450° C.

8. The method of claim 1, wherein said plasma anneal procedure, is performed in a nitrous oxide ambient, at a temperature between about 400 to 450° C., at a power between about 2000 to 4000 watts, at a pressure between about 5 to 10 torr, for a time between about 1 to 3 min., using a nitrous oxide flow between about 0.1 to 0.2 milliliters/min.

9. The method of claim 1, wherein said oxygen containing ambient is selected from a group consisting of oxygen, ozone, water, and nitric oxide.

10. The method of claim 1, wherein said upper electrode structure is comprised of polysilicon, obtained via deposition of a polysilicon layer, using LPCVD procedures, at a thickness between about 1000 to 5000 Angstroms, and patterned via a RIE procedure, using $Cl_2$ as an etchant.

11. The method of claim 1, wherein said upper electrode structure is comprised of aluminum, or of tungsten.

12. A method of fabricating a capacitor structure for a dynamic random access memory, (DRAM), device, featuring a nitrous oxide anneal procedure, performed after deposition of a tantalum oxide capacitor dielectric layer, comprising the steps of:

forming a storage node contact hole, in an insulator layer, exposing a portion of the top surface of a source/drain region, of a transfer gate transistor;

forming a planarized polysilicon plug structure, in said storage node contact hole;

forming a polysilicon storage node structure with a top surface of said polysilicon storage node structure comprised with hemispherical grain silicon, and with a portion of said polysilicon storage node structure, overlying and contacting said polysilicon plug structure;

depositing said tantalum oxide capacitor dielectric layer directly on hemispherical grain silicon surface, of polysilicon storage node structure;

performing said nitrous oxide anneal procedure, in a plasma, at a temperature between about 400 to 450° C., to create an annealed tantalum oxide capacitor dielectric layer; and forming a polysilicon upper electrode structure, on said annealed tantalum oxide capacitor dielectric layer.

13. The method of claim 12, wherein said tantalum oxide capacitor dielectric layer is obtained via a CVD procedure, at a temperature between about 400 to 450° C., at a thickness between about 80 to 110 Angstroms.

14. The method of claim 12, wherein said tantalum oxide layer is obtained via plasma vapor deposition procedures, or via R.F. sputtering, at a thickness between about 80 to 110 Angstroms.

15. The method of claim 12, wherein said annealed tantalum oxide capacitor dielectric layer is obtained via a plasma anneal procedure, performed in an nitrous oxide ambient, at a temperature between about 400 to 450° C., at a power between about 2000 to 4000 watts, at a pressure between about 5 to 10 torr, for a time between about 1 to 3 min., using a nitrous oxide flow between about 0.1 to 0.2 milliliters/min.

16. The method of claim 12, wherein said polysilicon upper electrode structure is formed from a polysilicon layer, obtained via an LPCVD procedure, at a thickness between about 1000 to 5000 Angstroms, with the polysilicon layer either doped in situ, during deposition, via the addition of arsine, or phosphine, to a silane ambient, or via an ion implantation procedure, applied to an intrinsically deposited polysilicon layer, using arsenic or phosphorous ions.

* * * * *